(12) United States Patent
Bouwkamp (10) Patent No.: US 10,342,167 B2
(45) Date of Patent: Jul. 2, 2019

(54) ELECTROMAGNETIC SHIELD FOR REARVIEW ASSEMBLY (71) Applicant: Gentex Corporation, Zeeland, MI (US)

(72) Inventor: David J. Bouwkamp, Zeeland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 24 days.

(21) Appl. No.: 15/800,240

(22) Filed: Nov. 1, 2017

(65) Prior Publication Data

US 2018/0124958 A1 May 3, 2018

Related U.S. Application Data (60) Provisional application No. 62/415,916, filed on Nov. 1, 2016.

(51) Int. Cl.
| H01L 21/00 | (2006.01) |
| H05K 9/00 | (2006.01) |
| B60R 1/08 | (2006.01) |
| G02B 5/08 | (2006.01) |
| G02F 1/153 | (2006.01) |
| G02F 1/157 | (2006.01) |
| H05K 7/20 | (2006.01) |
| B60R 1/04 | (2006.01) |
| B60R 1/12 | (2006.01) |
| G02F 1/15 | (2019.01) |

(52) U.S. Cl.
CPC ............. *H05K 9/0081* (2013.01); *B60R 1/04* (2013.01); *B60R 1/088* (2013.01); *G02B 5/08* (2013.01); *G02F 1/157* (2013.01); *G02F 1/1533* (2013.01); *H05K 7/20436* (2013.01); *H05K 7/20454* (2013.01); *H05K 9/0032* (2013.01); *B60R 2001/1215* (2013.01); *G02F 1/15* (2013.01)

(58) Field of Classification Search
CPC .................. H05K 9/0081; B60R 1/088; B60R 2001/1215; G02B 5/08; G02F 1/1533; G02F 1/157
See application file for complete search history.

(56) References Cited

U.S. PATENT DOCUMENTS

| 3,338,689 A | 8/1967 | Hetzel et al. |
| 5,508,889 A | 4/1996 | Ii |
| 5,557,063 A | 9/1996 | Mottahed |
| 5,717,577 A | 2/1998 | Mendolia et al. |
| 6,060,659 A | 5/2000 | Borowiec et al. |
| 6,239,359 B1 | 5/2001 | Lilienthal, II et al. |

(Continued)

FOREIGN PATENT DOCUMENTS

EP 1942713 A1 7/2008

OTHER PUBLICATIONS

MAJR Products, "Custom Board Level Shielding (5300 Series)," 2011, pp. 56-58.

Primary Examiner — Calvin Y Choi
(74) Attorney, Agent, or Firm — Price Heneveld LLP; Bradley D. Johnson (57) ABSTRACT A rearview assembly having a circuit board. A grounded heat sink is proximate the circuit board. A thermal pad is disposed between and in abutting contact with the circuit board and the grounded heat sink. An electromagnetic shield includes a plurality of spring tabs disposed about a periphery of the electromagnetic shield.

20 Claims, 12 Drawing Sheets (56) References Cited

U.S. PATENT DOCUMENTS

| | | |
|---|---|---|
| 6,266,877 B1 | 7/2001 | Borowiec et al. |
| 6,377,472 B1 | 4/2002 | Fan |
| 6,687,135 B1 | 2/2004 | Kitade |
| 6,729,905 B1 | 5/2004 | Hwang |
| 6,872,880 B2 | 3/2005 | King et al. |
| 6,930,891 B1 | 8/2005 | Hama et al. |
| 6,979,773 B2 | 12/2005 | Frsich |
| 7,095,626 B2 | 8/2006 | Seidler |
| 7,277,301 B2 | 10/2007 | Liang |
| 8,724,342 B2 | 5/2014 | Schrab |
| 2002/0166683 A1 | 11/2002 | Shlahtichman et al. |
| 2003/0067757 A1* | 4/2003 | Richardson ............. H01L 23/50 361/799 |
| 2007/0224851 A1* | 9/2007 | Togami .............. H01R 13/6594 439/76.1 |
| 2011/0299262 A1 | 12/2011 | Crotty |
| 2012/0044663 A1 | 2/2012 | Lu et al. |
| 2014/0307344 A1 | 10/2014 | Cammenga et al. |
| 2015/0232034 A1 | 8/2015 | Weller et al. |
| 2018/0029574 A1 | 2/2018 | Mannherz et al. |

\* cited by examiner

FIG. 13

ELECTROMAGNETIC SHIELD FOR REARVIEW ASSEMBLY

CROSS-REFERENCE TO RELATED APPLICATION

This application claims priority to and the benefit under 35 U.S.C. § 119(e) of U.S. Provisional Application No. 62/415,916, filed on Nov. 1, 2016, entitled "ELECTROMAGNETIC SHIELD FOR REARVIEW ASSEMBLY," the disclosure of which is hereby incorporated herein by reference in its entirety.

FIELD OF THE DISCLOSURE

The present disclosure generally relates to a rearview assembly, and more particularly to an electromagnetic shield for a rearview assembly for a vehicle.

SUMMARY OF THE DISCLOSURE

According to one aspect of the present disclosure, a rearview assembly having a circuit board. A grounded heat sink is proximate the circuit board. A thermal pad is disposed between and in abutting contact with the circuit board and the grounded heat sink. An electromagnetic shield includes a first component and a second component that is separate and distinct from the first component. At least one of the first and second components includes a plurality of spring tabs disposed about a periphery thereof.

According to another aspect of the present disclosure, an electromagnetic radiation assembly for a rearview device includes a circuit board having a grounded heat sink extending over the circuit board. A thermal pad is disposed between the circuit board and the grounded heat sink. An electromagnetic shield is disposed about a periphery of the electromagnetic shield. The electromagnetic shield includes a first component having a plurality of outwardly and inwardly extending spring tabs. A second component is slidingly received within the first component and includes a bridge extending across a midportion of the second component.

These and other features, advantages, and objects of the present disclosure will be further understood and appreciated by those skilled in the art by reference to the following specification, claims, and appended drawings.

DETAILED DESCRIPTION

The present illustrated embodiments reside primarily in combinations of method steps and apparatus components related to a rearview assembly. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

Figure 1:
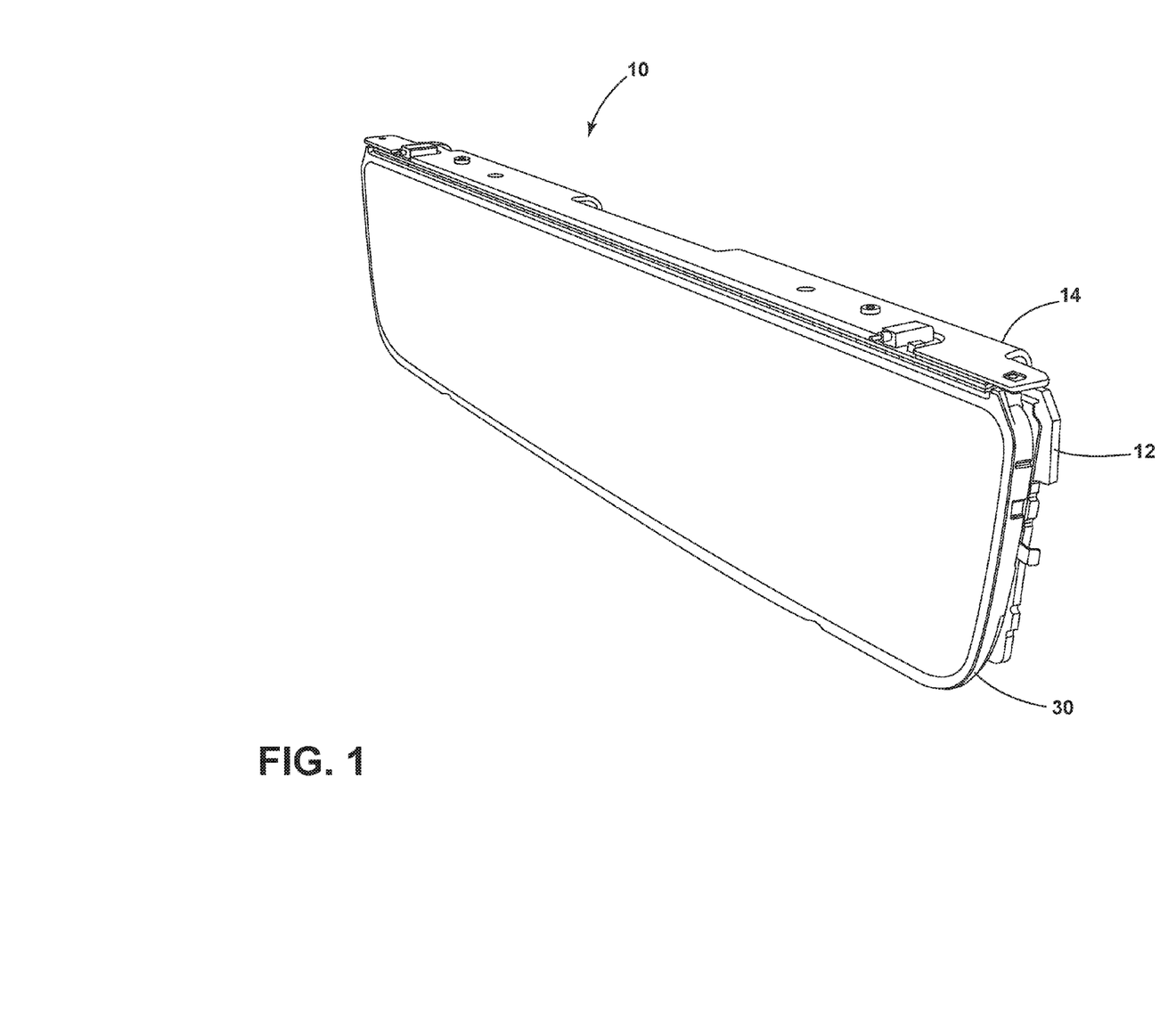
FIG. 1 is a front top perspective view of one embodiment of a rearview assembly incorporating an electromagnetic shield of the present disclosure.
Figure 2:
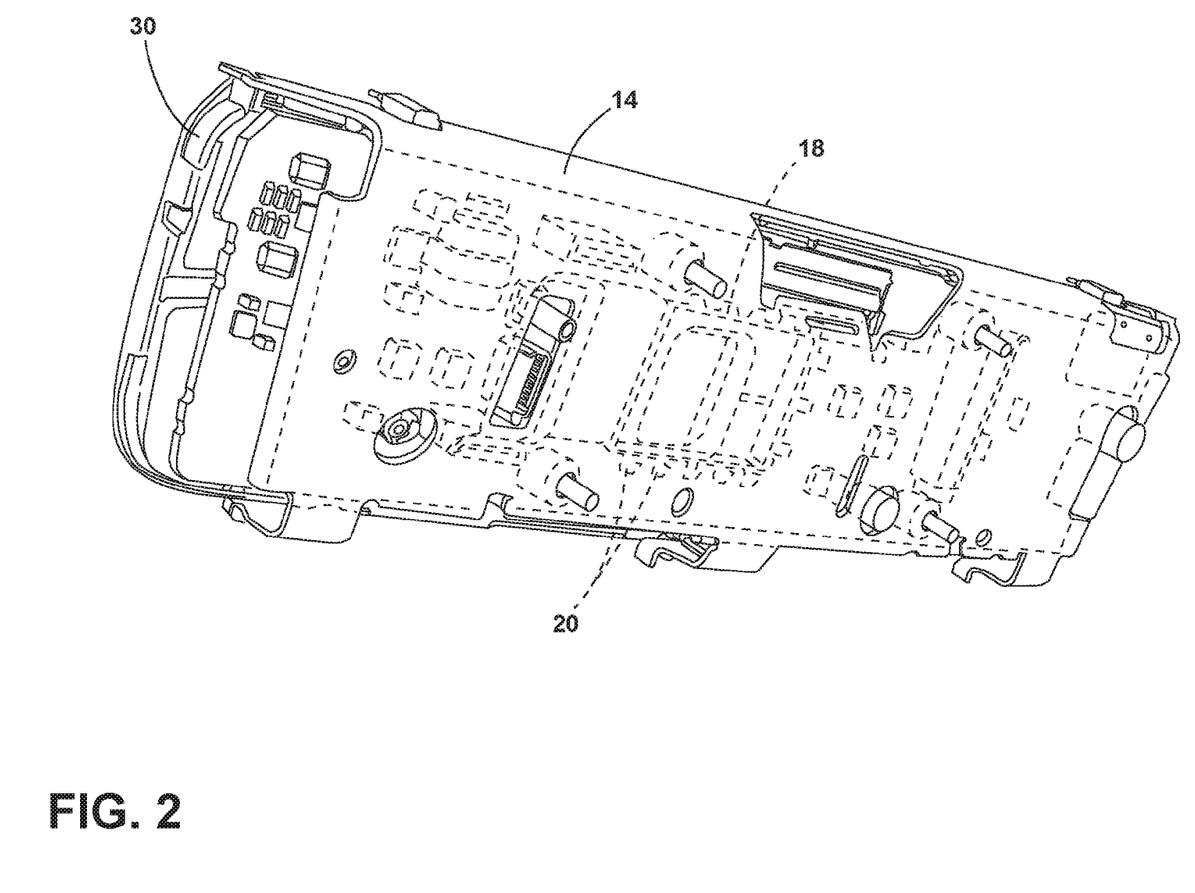
FIG. 2 is a rear top perspective view of a portion of the rearview assembly of FIG. 1 with the rear housing removed and illustrating a heat sink and an electromagnetic shield disposed on a rear side of the rearview assembly.
Figure 3:
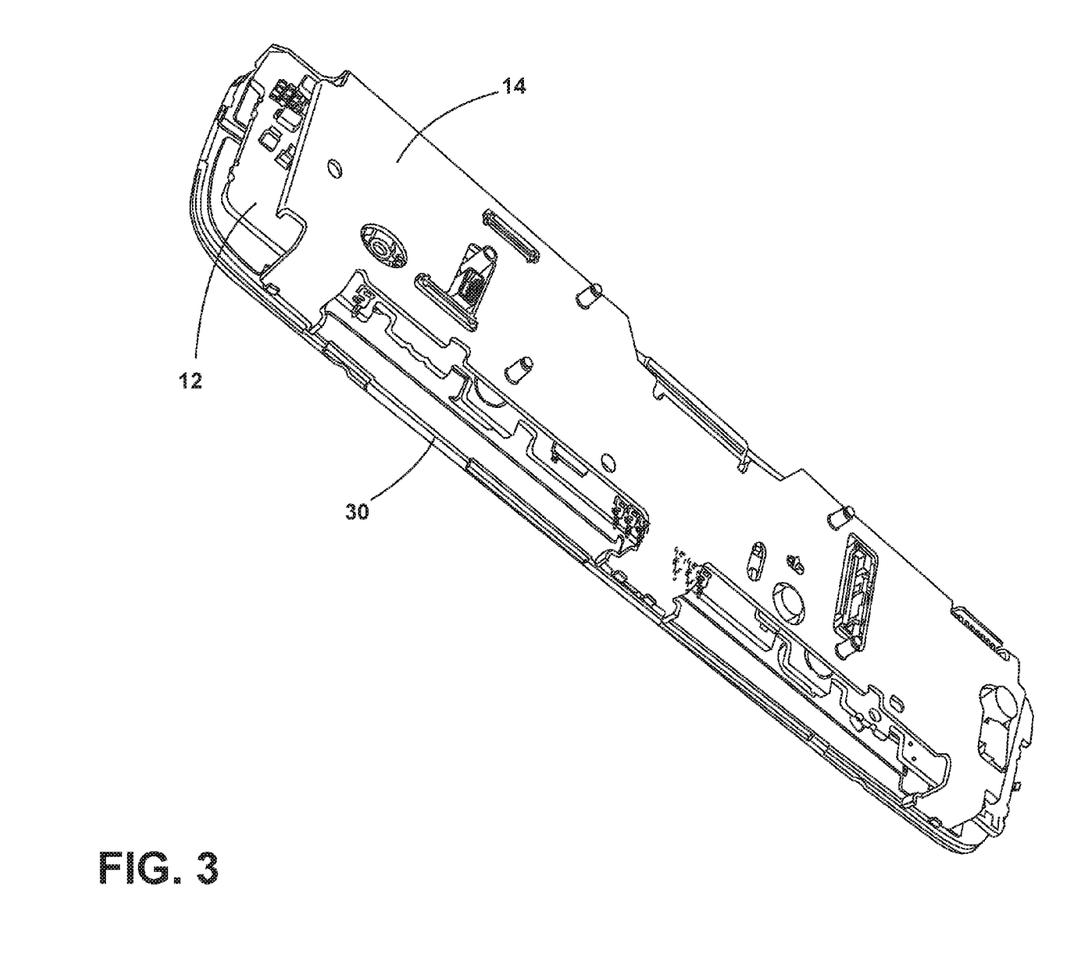
FIG. 3 is a bottom perspective view of the rearview assembly of FIG. 2.
Figure 4:
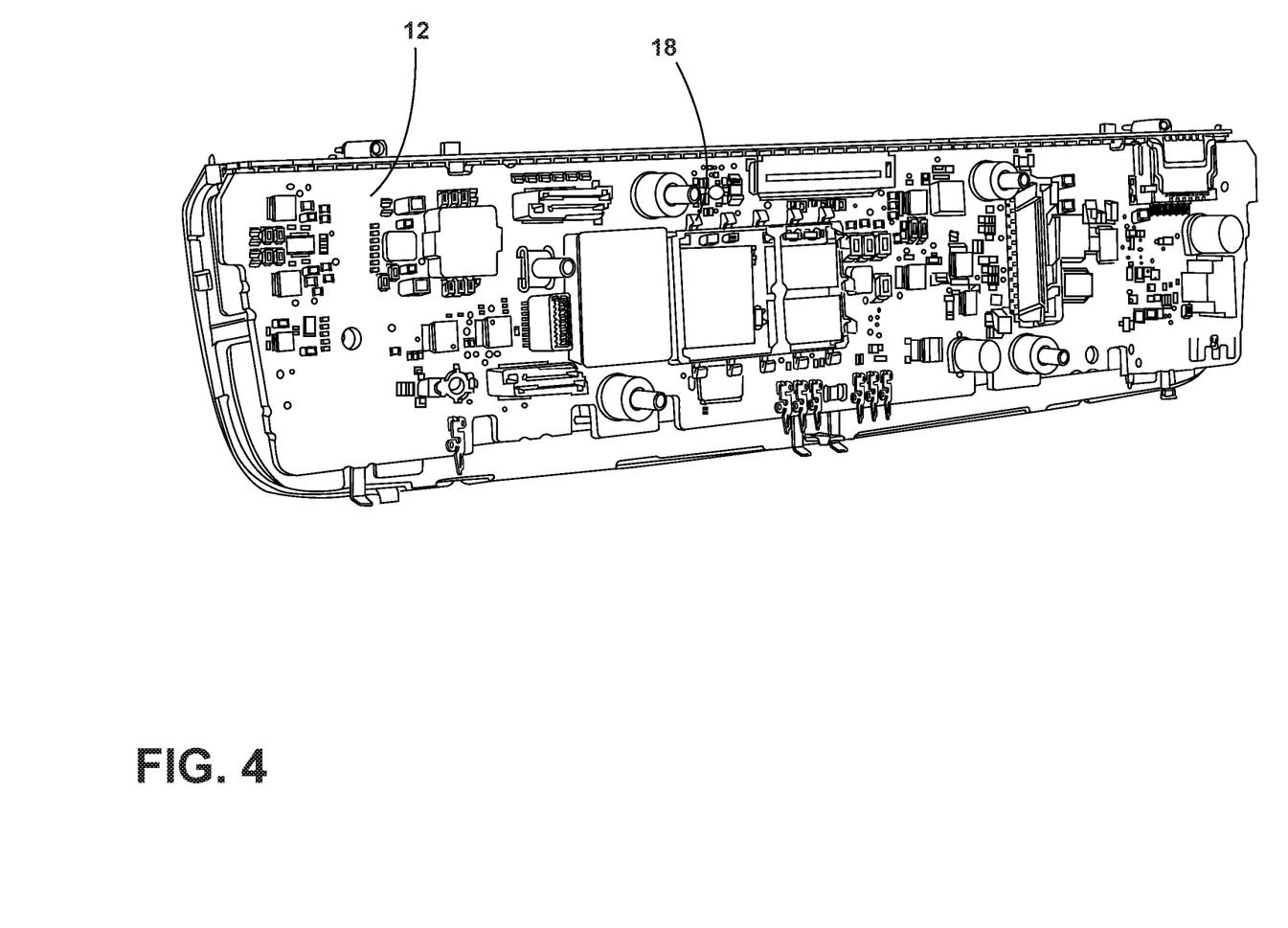
FIG. 4 is a rear perspective view of a circuit board of the rearview assembly of FIG. 2.
Figure 5:
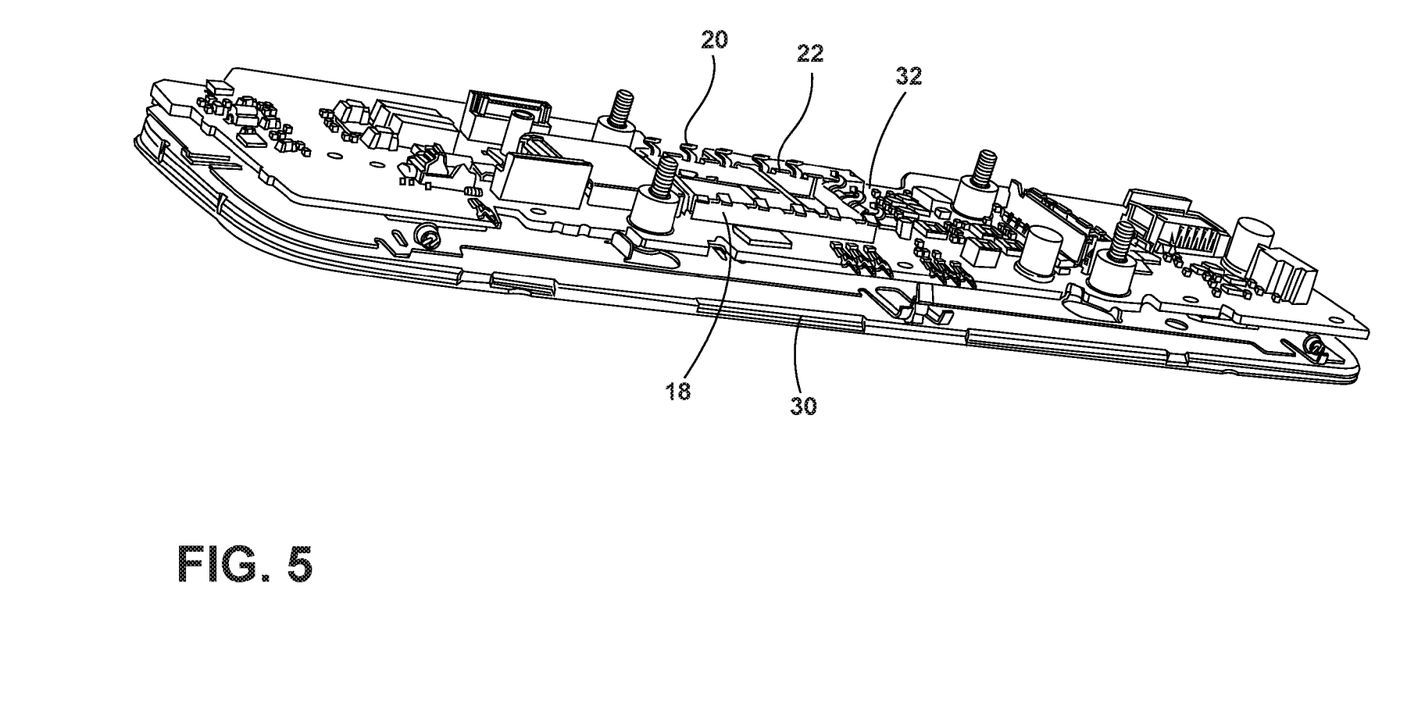
FIG. 5 is a bottom perspective view of the circuit board of the rearview assembly of FIG. 4.

For purposes of description herein, the terms "upper," "lower," "right," "left," "rear," "front," "vertical," "horizontal," and derivatives thereof, shall relate to the disclosure as oriented in FIG. 1. Unless stated otherwise, the term "front" shall refer to the surface of the device closer to an intended viewer of the device, and the term "rear" shall refer to the surface of the device further from the intended viewer of the device. However, it is to be understood that the disclosure may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The terms "including," "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises a . . . " does not, without more constraints, preclude the existence of additional identical elements in the process, method, article, or apparatus that comprises the element.

Referring to FIGS. 1-8, reference numeral 10 generally designates a rearview assembly having a circuit board 12. A grounded heat sink 14 is proximate the circuit board 12. A thermal pad 16 is disposed between and in abutting contact with the circuit board 12 and the grounded heat sink 14. An electromagnetic shield 18 includes a plurality of spring tabs 20 disposed about a periphery 22 of the electromagnetic shield 18.

Figure 6:
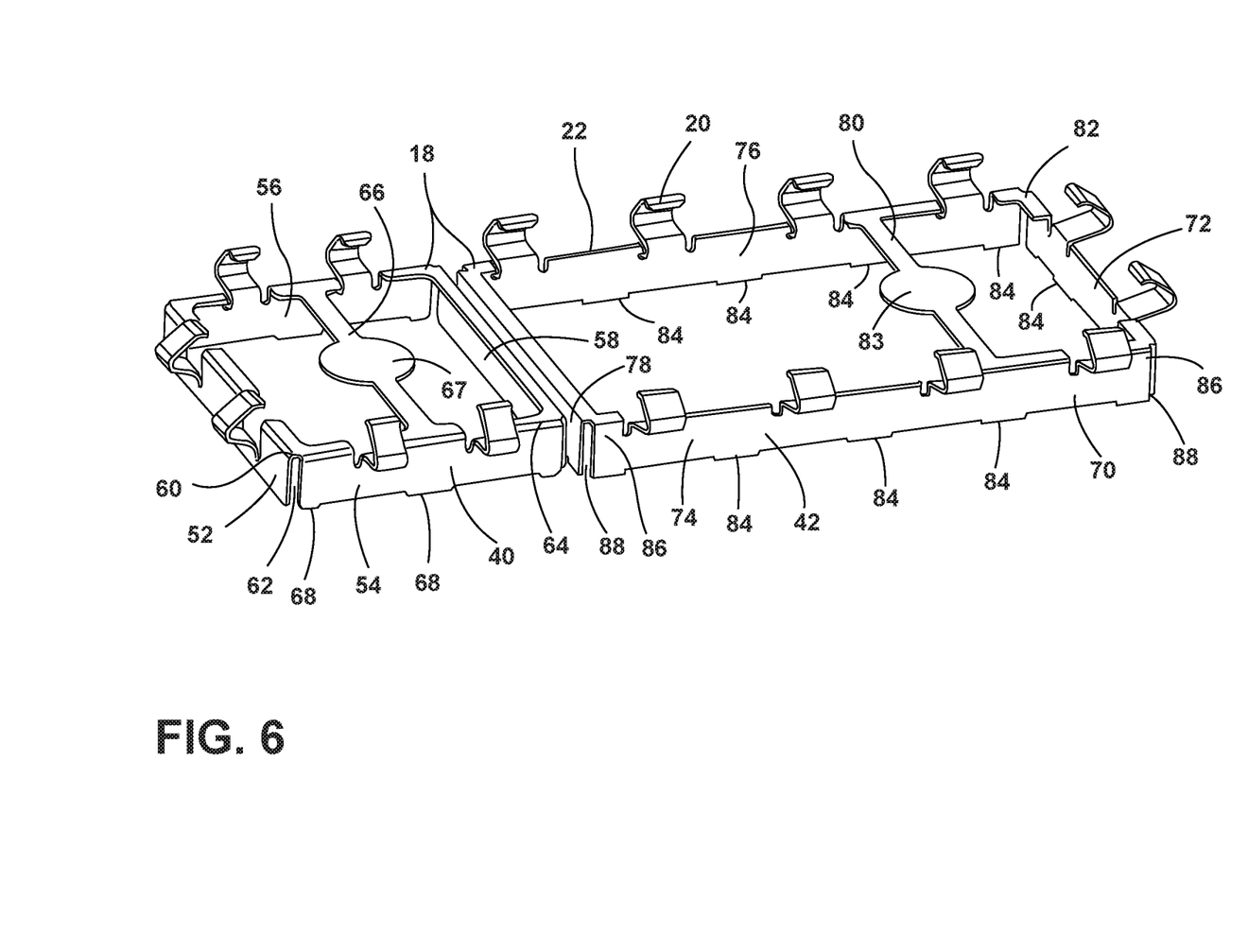
FIG. 6 is a top perspective view of one embodiment of an electromagnetic shield including first and second components.

With reference now to FIGS. 1-4, the rearview assembly 10 as set forth herein is generally configured for use as an electro-optic assembly that includes auto dimmable features. In addition, the rearview assembly 10 as set forth herein may also include a full display construction such that the rearview assembly 10 provides a display of a view external to the vehicle that is captured by an imager with a field of view outside the vehicle. The rearview assembly 10 includes an electro-optic assembly 30 in the front portion thereof. The electro-optic assembly 30 may include an electrochromic construction or other similar construction. In addition, the circuit board 12 of the rearview assembly 10 includes a variety of shielded electrical components 32 disposed proximate the electromagnetic shield 18. As shown in FIG. 6, the electromagnetic shield 18 includes first and second components 40, 42 that are generally configured to guard against incoming or outgoing electromagnetic radiation emissions that can impact the performance of the rearview assembly 10.

Figure 7:
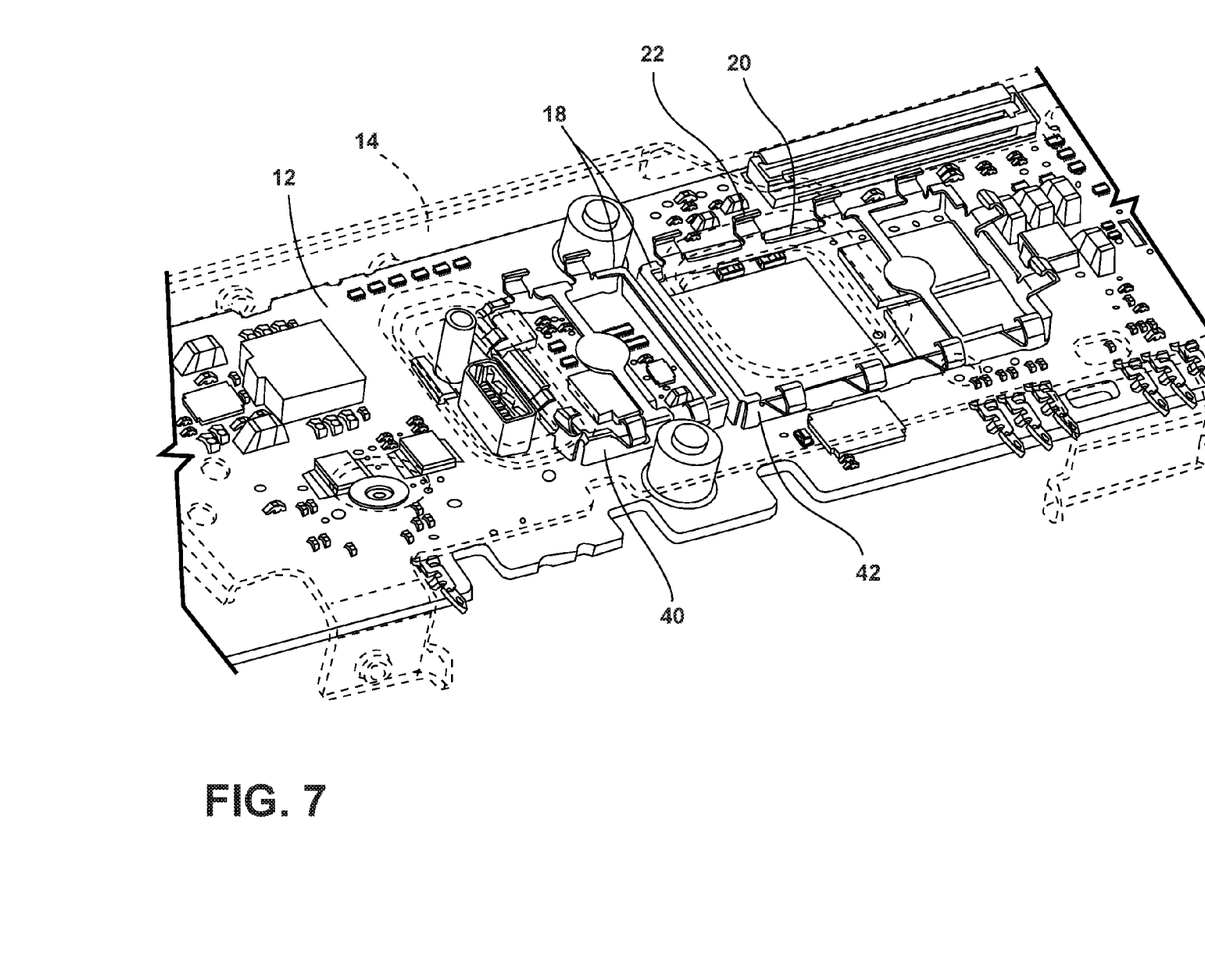
FIG. 7 is a rear bottom perspective view of a rearview assembly of the present disclosure with the electromagnetic shield in position on a circuit board.
Figure 8:
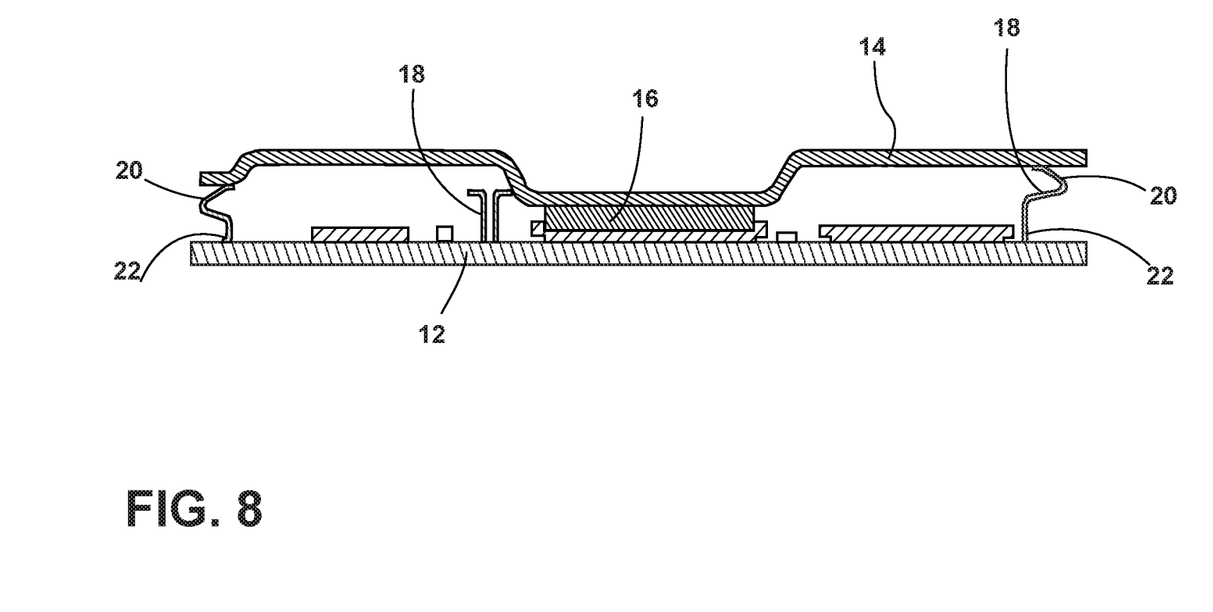
FIG. 8 is a side cross-sectional view of a portion of a rearview assembly incorporating the EMI shield and grounded heat sink of the present disclosure.

With reference now to FIGS. 6-8, this design improves upon traditional two-piece shield designs by utilizing compliant spring fingers in the form of spring tabs 20 on the electromagnetic shield 18 to make contact with the heat sink 14, rather than using a lid. This allows the field programmable gate array (FPGA) chip, which is electromagnetic shielded by the compliant shield, to make improved thermal contact to the heat sink 14 via a single thermal pad 16, removing even more heat from the chip than traditional designs. Traditional two-piece shields generally require two pieces of thermal tape to connect the FPGA chip to the heat sink 14, resulting in decreased thermal performance and a potentially shorter life span.

With reference again to FIGS. 6-8, the first component 40 of the electromagnetic shield 18 includes a peripheral rim 50 that provides structural rigidity to the first component 40. The peripheral rim 50 includes four walls 52, 54, 56, 58, although additional walls may be included in the first component 40. Corners 60 of the first component 40 of the electromagnetic shield 18 generally define slots 62 that allow the walls 52, 54, 56, 58 of the peripheral rim 50 to be adjusted slightly, if desired, during installation. In addition, the first and second components 40, 42 also include upper lateral walls 64. The upper lateral walls 64 are integral with the walls 52, 54, 56, 58 of the peripheral rim 50 and can also assist in providing structural rigidity to the electromagnetic shield 18. In addition, the first component 40 includes a bridge 66. The bridge 66 extends across the first component 40 between non-adjacent walls 52, 56 and includes an enlarged central portion 67. The spring tabs 20 are integral with and extend from the walls 52, 54, 56, 58 of the peripheral rim 50. As previously noted, the spring tabs 20 of the electromagnetic shield 18 make contact with the heat sink 14 and are generally compliant or compressive in structure, thereby maintaining good contact with the heat sink 14 (FIG. 8).

With reference again to FIG. 6, the walls 52, 54, 56, 58 of the peripheral rim 50 also include feet 68 indeterminately spaced about a bottom portion of the peripheral rim 50. The feet 68 are configured to engage the circuit board 12, and may be disposed within slots defined in the circuit board 12, or simply abut a surface of the circuit board 12. Notably, the spring tabs 20 face inwardly on each of the first and second components 40, 42. However, it is contemplated that the spring tabs 20 could also face outwardly, or face inwardly and outwardly. In addition, it will be noted that the spring tabs 20 extend from only three of the four walls that define the peripheral rim 50 of the first component 40. However, additional spring tabs 20 could also be positioned on those walls that lack the spring tabs 20 to provide additional spring force on the heat sink 14. Application of the heat sink 14 protects and shields electrical components that are disposed on the circuit board 12. This shielding improves the performance of the electrical components, while also increasing the lifetime of these components and the rearview assembly 10 generally.

With reference again to FIG. 6, the second component 42 includes features similar to those of the first component 40. A peripheral rim 70 of the second component 42 includes walls 72, 74, 76, 78. The walls 74, 76 are longer than the walls 72, 78. A bridge 80 extends across the peripheral rim 70 between the walls 74, 76. An upper lateral wall 82 is disposed at a top portion of the second component 42. The bridge 80 connects the upper lateral wall 82 disposed proximate the walls 74, 76. The bridge 80 includes an enlarged central portion 83. In addition, each of the walls 72, 74, 76, 78 includes feet 84 extending from a bottom portion of each wall 72, 74, 76, 78. Each corner 86 of the peripheral rim 70 defines a slot 88. Each of the spring tabs 20 extends upwardly from the walls 72, 74, 76, 78 of the peripheral rim 70 and provides a biasing force away from the walls 72, 74, 76, 78 of the peripheral rim 70 against the heat sink 14.

The compliant electromagnetic shield 18 has unique spring tabs 20 disposed about the periphery 22 that make contact to ground on the circuit board 12, as well as the heat sink 14, once installed. The spring tab 20 spacing coupled with contact to the heat sink 14 allows the use of a single piece of thermal tape, as well as other assembly improvements. This construction solves the problem of electromagnetic shielding of the FPGA chip while at the same time improving heat transfer from the FPGA chip to the heat sink 14.

Figures 9, 10:
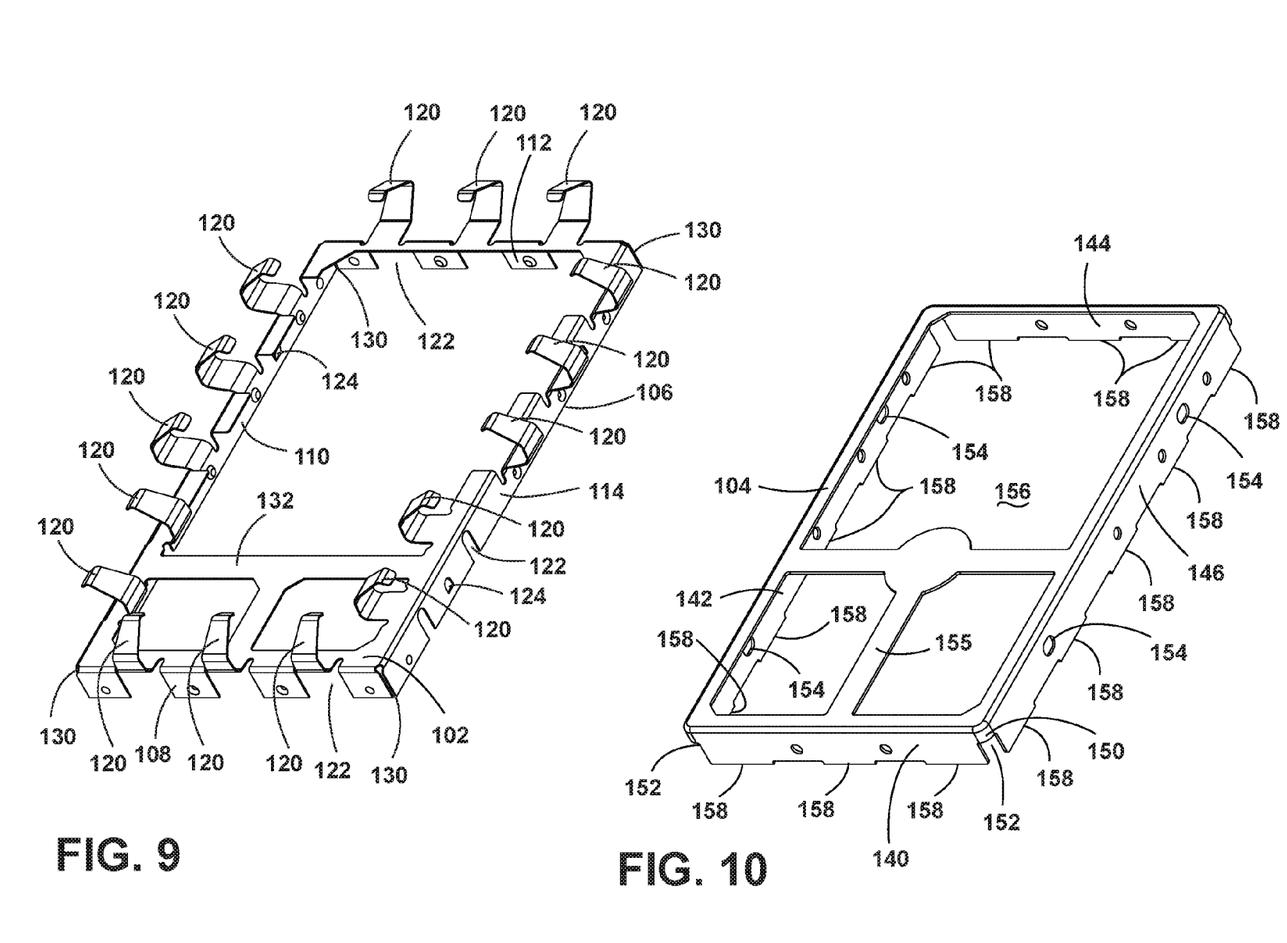
FIG. 9 is a top perspective view of a first component of an electromagnetic shield of the present disclosure.
FIG. 10 is a top perspective view of a second component of an electromagnetic shield of the present disclosure.
Figures 11, 12:
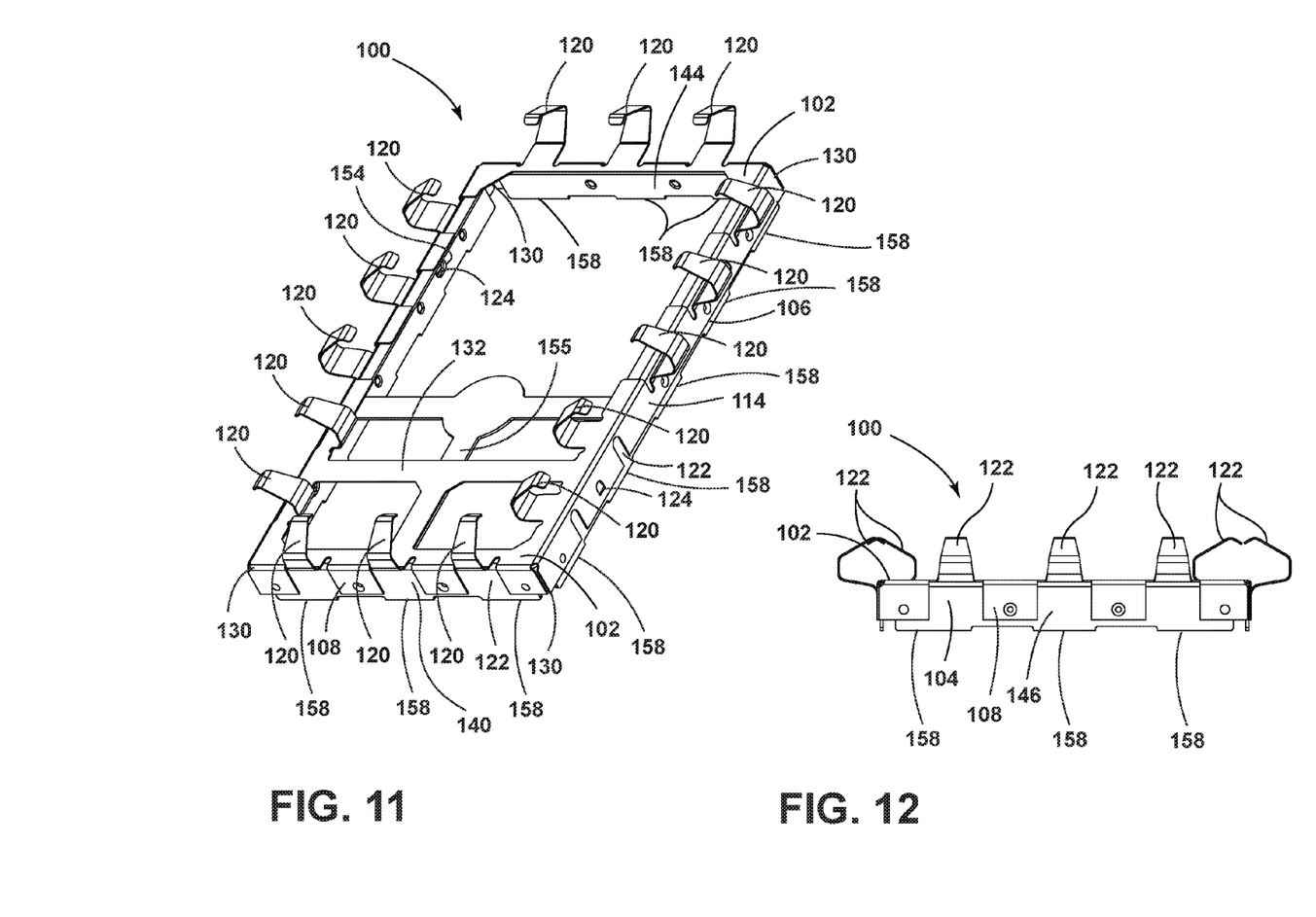
FIG. 11 is a top perspective view of an electromagnetic shield of the present disclosure including the first and second components of FIGS. 9 and 10.
FIG. 12 is a side elevational view of the electromagnetic shield of FIG. 11.
Figure 13:
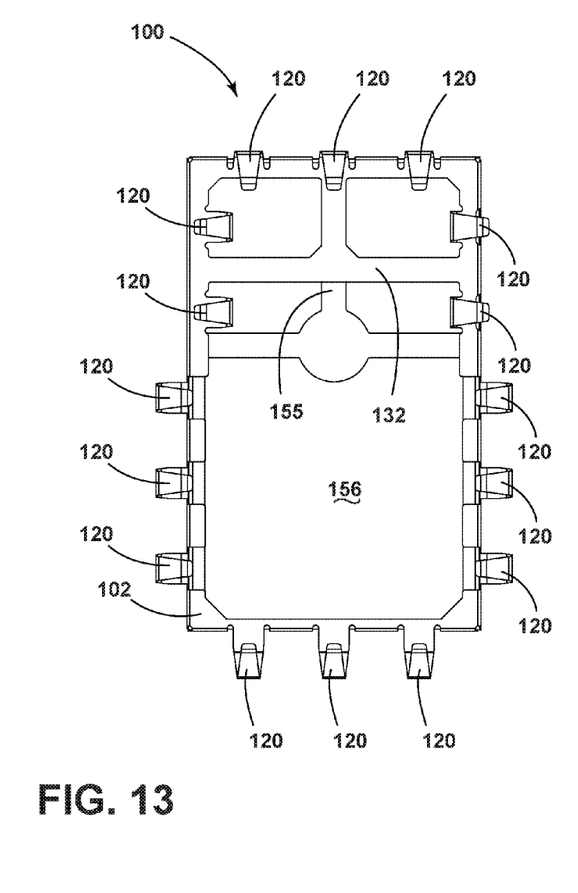
FIG. 13 is a top plan view of an electromagnetic shield of FIG. 11.
Figure 14:
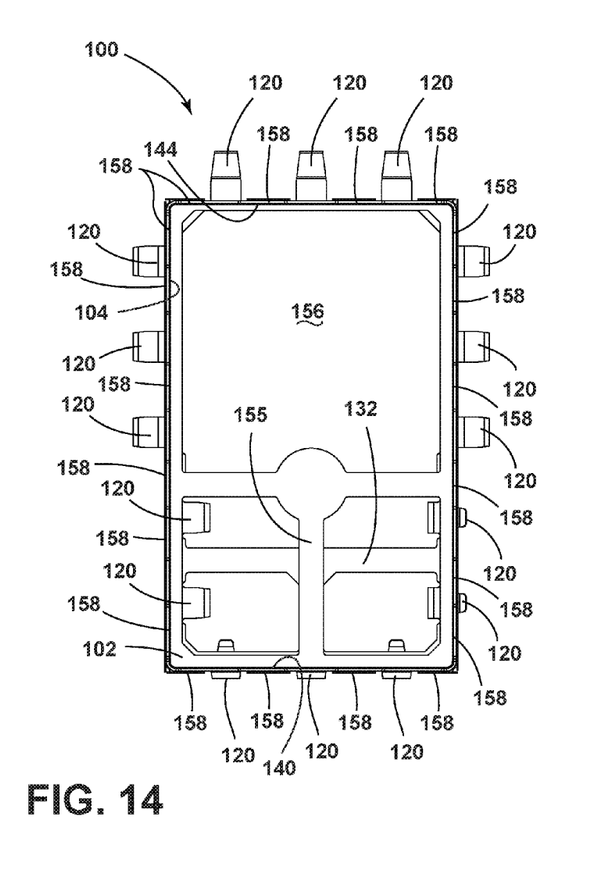
FIG. 14 is a bottom plan view of the electromagnetic shield of FIG. 11.
Figures 15, 16:
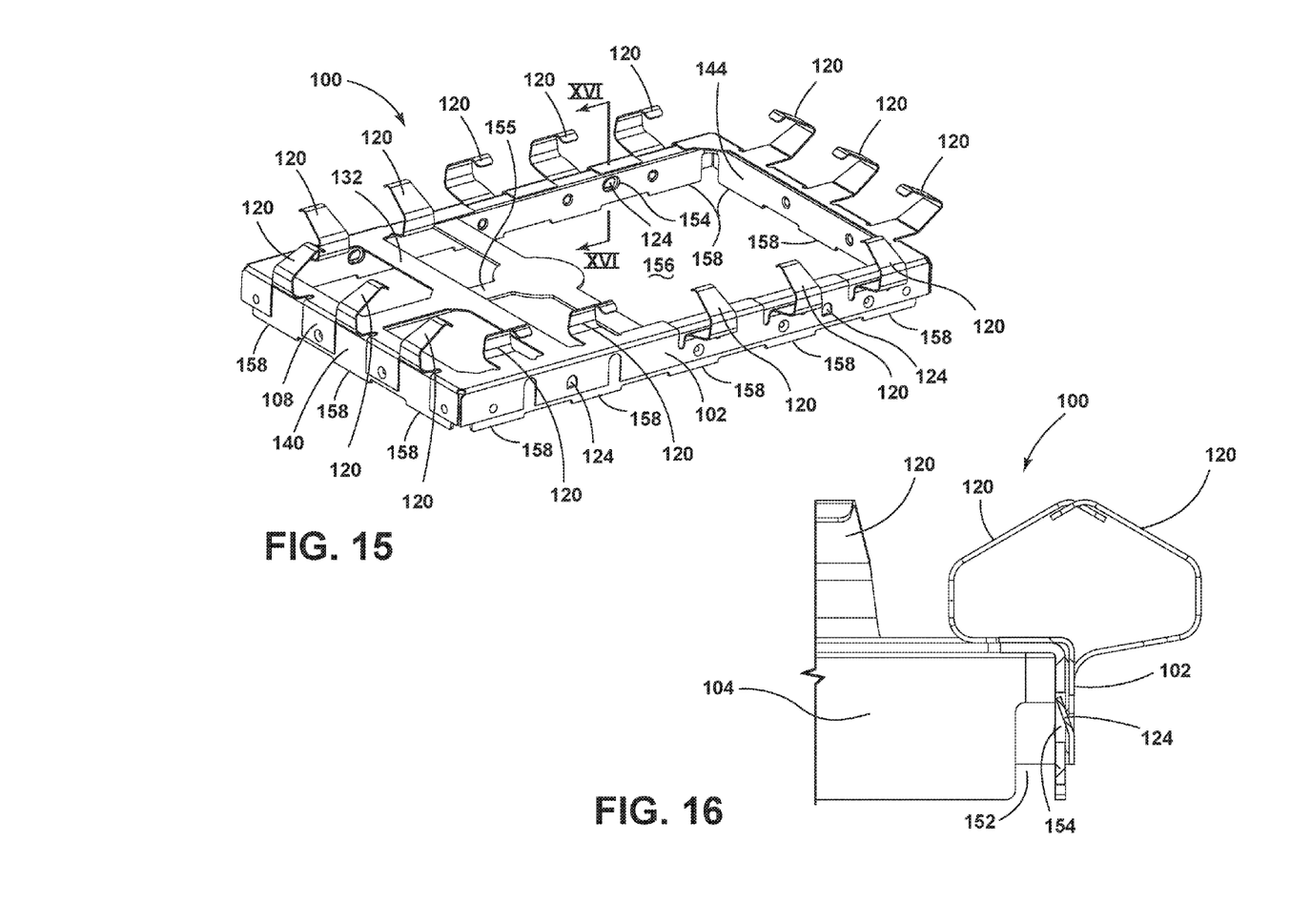
FIG. 15 is a side perspective view of an electromagnetic shield of the present disclosure.
FIG. 16 is an enlarged partial elevational view of spring tabs of an electromagnetic shield of the present disclosure.

With reference now to FIGS. 9 and 10, another construction of an electromagnetic shield 100 is illustrated with first and second components 102, 104. The first component 102 includes a peripheral rim 106 defined by a plurality of walls 108, 110, 112, 114. The peripheral rim 106 includes upwardly extending spring tabs 120 that face inwardly and which also face outwardly. Each wall 108, 110, 112, 114 of the peripheral rim 106 includes a slot 122. On the first and third walls 108, 112 of the peripheral rim 106, the slots 122 are lined up and adjacent to the spring tabs 120. In addition, the peripheral rim 106 includes a plurality of retention features configured to secure the first component 102 with the second component 104, as explained in further detail herein. The retention features of the first component 102 include retention tabs 124 that are canted inwardly from the peripheral rim 106 of the first component 102. Each corner 130 of the peripheral rim 106 of the first component 102 is formed by folding adjacent walls into contact with one another. Also, notably, the first component 102 includes a bridge 132 that extends to at least three walls of the first component 102.

With reference again to FIG. 10, the second component 104 of the electromagnetic shield 100 includes a peripheral rim 105 defined by a plurality of walls 140, 142, 144, 146. Corners 150 of the second component 104 define slots 152 that assist in nesting the first component 102 over the second components 104 during installation. The walls 140, 142, 144, 146 of the second component 104 include a plurality of retention features in the form of retention apertures 154 that are defined on the peripheral rim 105, and which are configured to receive the retention tabs 124 of the first component 102. The second component 104 includes a bridge 155 that extends across a central opening 156 of the second component 104, and which connects with three walls of the peripheral rim 105. The second component 104 includes a plurality of feet 158 configured to abut a circuit board to which the second component 104 is attached. The plurality of feet 158 may be inserted into slots defined in the circuit board, or may simply abut the circuit board.

With reference now to FIGS. 11-16, when nested, the first component 102 extends over the second component 104, substantially concealing portions of the walls of the second component 104. As the first component 102 slides over the peripheral rim of the second component 104, the retention features of the first component 102 are pushed slightly outward until the retention tabs 124 of the first component 102 snap-fittingly engage the retention apertures 154 of the second component 104. Once the retention tabs 124 of the first component 102 have engaged the retention apertures 154 of the second component 104, the first component 102 and the second component 104 are generally secured together. It will be understood that the first component 102 and the second component 104 can be assembled prior to installation onto a printed circuit board, or the second component 104 may be installed onto the printed circuit board, and the first component 102 later positioned over the second component 104 and operably coupled with the second component 104 at that time. It will also be understood that other retention features are also possible, or that the spring tabs 120 may be disposed on the second component 104 and retention apertures may be disposed on the first component 102. In addition, it is contemplated that multiple retention features may be disposed on the peripheral rims 50, 105, or a single retention feature may be disposed on each peripheral rim 50, 105.

It will be understood by one having ordinary skill in the art that construction of the described disclosure and other components is not limited to any specific material. Other exemplary embodiments of the disclosure disclosed herein may be formed from a wide variety of materials, unless described otherwise herein.

For purposes of this disclosure, the term "coupled" (in all of its forms, couple, coupling, coupled, etc.) generally means the joining of two components (electrical or mechanical) directly or indirectly to one another. Such joining may be stationary in nature or movable in nature. Such joining may be achieved with the two components (electrical or mechanical) and any additional intermediate members being integrally formed as a single unitary body with one another or with the two components. Such joining may be permanent in nature or may be removable or releasable in nature unless otherwise stated.

It is also important to note that the construction and arrangement of the elements of the disclosure, as shown in the exemplary embodiments, is illustrative only. Although only a few embodiments of the present innovations have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited. For example, elements shown as integrally formed may be constructed of multiple parts, or elements shown as multiple parts may be integrally formed, the operation of the interfaces may be reversed or otherwise varied, the length or width of the structures and/or members or connector or other elements of the system may be varied, the nature or number of adjustment positions provided between the elements may be varied. It should be noted that the elements and/or assemblies of the system may be constructed from any of a wide variety of materials that provide sufficient strength or durability, in any of a wide variety of colors, textures, and combinations. Accordingly, all such modifications are intended to be included within the scope of the present innovations. Other substitutions, modifications, changes, and omissions may be made in the design, operating conditions, and arrangement of the desired and other exemplary embodiments without departing from the spirit of the present innovations.

It will be understood that any described processes or steps within described processes may be combined with other disclosed processes or steps to form structures within the scope of the present disclosure. The exemplary structures and processes disclosed herein are for illustrative purposes and are not to be construed as limiting.

It is also to be understood that variations and modifications can be made on the aforementioned structures and methods without departing from the concepts of the present disclosure, and further it is to be understood that such concepts are intended to be covered by the following claims unless these claims by their language expressly state otherwise.

What is claimed is:

1. A rearview assembly comprising:
a circuit board;
a grounded heat sink proximate the circuit board;
a thermal pad disposed between and in abutting contact with the circuit board and the grounded heat sink; and
an electromagnetic shield including a first component and a second component that is separate and distinct from the first component, wherein the first component is received within the second component and both the first component and the second component are in removable abutting contact with the circuit board, and wherein at least one of the first component and the second component includes a plurality of spring tabs disposed about a periphery thereof and extending away from the circuit board.

2. The rearview assembly of claim 1, wherein a peripheral rim of the first and second components includes retention features.

3. The rearview assembly of claim 2, wherein the retention features of the first component are complementary to and configured to securely engage with the retention features of the second component.

4. The rearview assembly of claim 1, wherein the first component is configured to nest over the second component.

5. The rearview assembly of claim 1, wherein at least one of the first component and the second component includes a bridge.

6. The rearview assembly of claim 1, wherein both the first component and the second component include a bridge, and wherein the bridge of the first component is not aligned with the bridge of the second component when the first component is in a nested position over the second component.

7. The rearview assembly of claim 1, wherein the first component includes a plurality of both inwardly and outwardly facing spring tabs.

8. The rearview assembly of claim 7, wherein the first component includes a peripheral rim, and wherein at least one of the inwardly facing spring tabs is disposed adjacent to a gap formed in the peripheral rim.

9. The rearview assembly of claim 1, wherein the second component includes corners defining slots.

10. The rearview assembly of claim 1, wherein both the first component and the second component include a peripheral rim, and wherein the peripheral rim of the first component is smaller than the peripheral rim of the second component.

11. The rearview assembly of claim 5, wherein the bridge is coupled with at least three sides of at least one of the first and second components.

12. An electromagnetic radiation assembly for a rearview device comprising:
a circuit board including a grounded heat sink extending over the circuit board;
a thermal pad disposed between the circuit board and the grounded heat sink; and
an electromagnetic shield disposed about a periphery of the circuit board, the electromagnetic shield comprising:
a first component having a plurality of spring tabs extending away from the circuit board, wherein the spring tabs engage the grounded heat sink; and
a second component slidingly received within the first component and having a bridge extending across a midportion of the second component.

13. The electromagnetic radiation assembly of claim 12, wherein the second component includes corners defining slots.

14. The electromagnetic radiation assembly of claim 12, wherein the first component includes a peripheral rim, and wherein at least one of the inwardly extending spring tabs is disposed adjacent to a gap formed in the peripheral rim.

15. The electromagnetic radiation assembly of claim 12, wherein both the first component and the second component include a peripheral rim, and wherein the peripheral rim of the first component is smaller than the peripheral rim of the second component.

16. The electromagnetic radiation assembly of claim 12, wherein the bridge is coupled with at least three sides of at least one of the first and second components.

17. A rearview assembly comprising:
a circuit board;
a grounded heat sink proximate the circuit board;
a thermal pad disposed between and in abutting contact with the circuit board and the grounded heat sink; and
an electromagnetic shield including a first component and a second component, wherein the first component is received within the second component and both the first component and the second component are in removable abutting contact with the circuit board, and wherein one of the first component and the second component includes a plurality of retention features disposed about a periphery thereof, and which are configured to engage complementary retention features of the other of the first and second components.

18. The rearview assembly of claim 17, wherein the retention features of the first and second components are disposed on a peripheral rim of each of the first and second components.

19. The rearview assembly of claim 17, wherein the retention features of the first and second components are configured to snap-fittingly engage.

20. The rearview assembly of claim 17, wherein the retention features of the first component include retention tabs that are canted inwardly from a peripheral rim of the first component, and wherein the retention features of the second component include retention apertures defined through a peripheral rim of the second component.

* * * * *